United States Patent
Jones, Jr.

(10) Patent No.: US 8,239,740 B2
(45) Date of Patent: *Aug. 7, 2012

(54) CIRCUIT AND TECHNIQUE FOR REDUCING PARITY BIT-WIDTHS FOR CHECK BIT AND SYNDROME GENERATION FOR DATA BLOCKS THROUGH THE USE OF ADDITIONAL CHECK BITS TO INCREASE THE NUMBER OF MINIMUM WEIGHTED CODES IN THE HAMMING CODE H-MATRIX

(75) Inventor: Oscar Frederick Jones, Jr., Colorado Springs, CO (US)

(73) Assignee: Invensas Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/102,522

(22) Filed: May 6, 2011

(65) Prior Publication Data
US 2011/0209033 A1 Aug. 25, 2011

Related U.S. Application Data

(62) Division of application No. 11/855,070, filed on Sep. 13, 2007, now Pat. No. 7,962,837.

(51) Int. Cl.
*H03M 13/00* (2006.01)
(52) U.S. Cl. .................................. 714/781
(58) Field of Classification Search ............... 714/781
See application file for complete search history.

(56) References Cited

U.S. PATENT DOCUMENTS

| | | | | | |
|---|---|---|---|---|---|
| 3,623,155 | A | * | 11/1971 | Hsiao et al. | 714/785 |
| 3,825,893 | A | * | 7/1974 | Bossen et al. | 714/757 |
| 4,072,853 | A | * | 2/1978 | Barlow et al. | 714/758 |
| 4,334,309 | A | * | 6/1982 | Bannon et al. | 714/766 |
| 4,388,684 | A | * | 6/1983 | Nibby et al. | 714/52 |
| 7,721,177 | B2 | * | 5/2010 | Gammel et al. | 714/752 |
| 7,725,810 | B2 | * | 5/2010 | Paumier et al. | 714/800 |
| 7,853,854 | B2 | * | 12/2010 | Paumier et al. | 714/755 |

OTHER PUBLICATIONS

Ghosh, S. et al.; "Selecting Error Correction Codes to Minimize Power in Memory Checker Circuits"; Journal of Low Power Electronics, vol. 1, 2005, p. 26.
Ghosh, S. et al.; "Reducing Power Consumption in Memory ECC Checkers", Proceedings of the IEEE International Test Conference (ITC-2004), Charlotte, NC, Oct. 2004, p. 10.

* cited by examiner

*Primary Examiner* — Joseph D Torres
(74) *Attorney, Agent, or Firm* — Lerner, David, Littenberg, Krumholz & Mentlik, LLP

(57) ABSTRACT

A circuit and technique for reducing parity bit-widths for check bit and syndrome generation is implemented through the use of additional check bits to increase the number of minimum weighted codes in the Hamming Code H-Matrix. The circuit and technique of the present invention may be implemented while adding no additional correction/detection capability, in order to reduce the number of data bits that are used for each check bit/syndrome generation and to reduce the width of the parity generating circuitry.

2 Claims, 6 Drawing Sheets

ERROR CORRECTION FLOW n = Number of Codeword Bits; k = Number of Data Bits; n-k = Number of Check Bits/Syndrome Bits
Width (Number of Inputs) of Write Parity Generator is the Maximum Number of "1s" in a Row of the H-Matrix
Width (Number of Inputs) of Read Parity Generator is One More than the Maximum Number of "1s" in a Row of the H-Matrix NUMBER OF CHECK BITS VERSUS NUMBER OF AVAILABLE WEIGHTED CODES
(CHECK BITS FROM 5 THROUGH 11)

| NUMBER OF CHECK BITS | WEIGHT OF CODE | | | | | | | | | | TOTAL NO. OF WEIGHT > 1 CODES |
|---|---|---|---|---|---|---|---|---|---|---|---|
| | 2 | 3 | 4 | 5 | 6 | 7 | 8 | 9 | 10 | 11 | |
| 5 | 10 | 10 | 5 | 1 | | | | | | | 26 |
| 6 | 15 | 20 | 15 | 6 | 1 | | | | | | 57 |
| 7 | 21 | 35 | 35 | 21 | 7 | 1 | | | | | 120 |
| 8 | 28 | 56 | 70 | 56 | 28 | 8 | 1 | | | | 247 |
| 9 | 36 | 84 | 126 | 126 | 84 | 36 | 9 | 1 | | | 502 |
| 10 | 45 | 120 | 210 | 252 | 210 | 120 | 45 | 10 | 1 | | 1013 |
| 11 | 55 | 165 | 330 | 462 | 462 | 330 | 165 | 55 | 11 | 1 | 2036 |

Weight = 0, Not Available, Reserved Vector for "No Errors"
Weight = 1, Not Available, Reserved Vector for "Check Bit Error"

*Fig. 2*

Figures 3A, 3B:
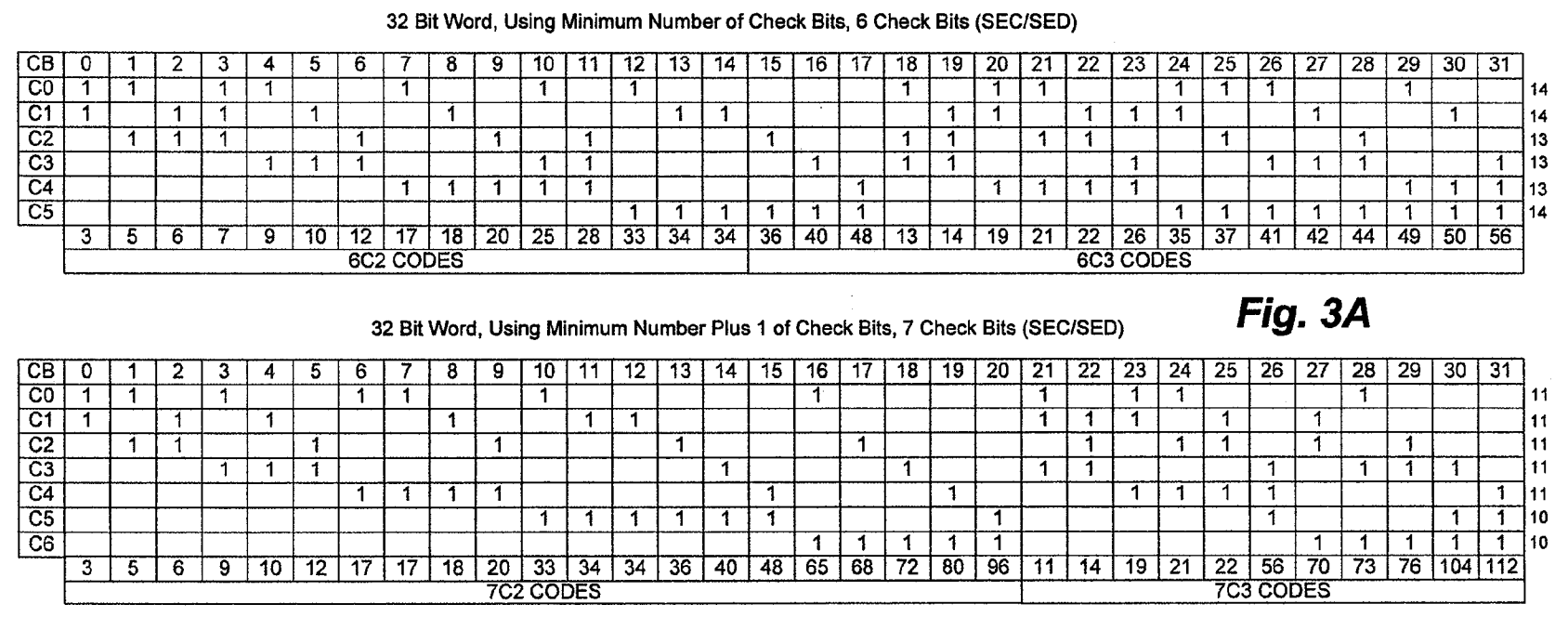

Fig. 3A — 32 Bit Word, Using Minimum Number of Check Bits, 6 Check Bits (SEC/SED), 6C2 CODES / 6C3 CODES Fig. 3B — 32 Bit Word, Using Minimum Number Plus 1 of Check Bits, 7 Check Bits (SEC/SED), 7C2 CODES / 7C3 CODES

Fig. 3C — 32 Bit Word, Using Minimum Number Plus 2 of Check Bits, 8 Check Bits (SEC/SED), 8C2 CODES / 8C3 CODES

Fig. 3D — 32 Bit Word, Using Minimum Number Plus 3 of Check Bits, 9 Check Bits (SEC/SED), 9C2 CODES Fig. 4A — First 32 Bits of 64 Bit Word, Using Minimum Number of Check Bits, 7 Check Bits (SEC/SED)

Fig. 4B — Last 32 Bits of 64 Bit Word, Using Minimum Number of Check Bits, 7 Check Bits (SEC/SED)

Fig. 5A

First 32 Bits of 64 Bit Word, Using Minimum Number Plus 1 of Check Bits, 8 Check Bits (SEC/SED)

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | |
|---|---|---|---|---|---|---|---|---|---|---|---|---|---|---|---|---|---|---|---|---|---|---|---|---|---|---|---|---|---|---|---|---|---|
| C0 | 1 | | | | | | | | | | | | | | | | | | | | | 1 | | | | | | | 1 | | 1 | | |
| C1 | 1 | 1 | | | | | | | | | | | | | 1 | | | 1 | | 1 | | | | | | | | | | 1 | 1 | 1 | |
| C2 | 1 | 1 | 1 | | | | | | | 1 | | | | | | 1 | | | 1 | | 1 | | | | | 1 | | 1 | 1 | | | | |
| C3 | | 1 | 1 | 1 | | | | 1 | | | | | | 1 | | | 1 | | | | | | | 1 | 1 | | | | | | | 1 | |
| C4 | | | 1 | 1 | 1 | | | | 1 | | | | 1 | | | | | 1 | | | | | 1 | 1 | | | | | | | | 1 | |
| C5 | | | | 1 | 1 | 1 | | | | 1 | | 1 | | | | | | | 1 | | | 1 | 1 | | | | | 1 | | | 1 | | |
| C6 | | | | | 1 | 1 | 1 | | | | 1 | 1 | | | | | | | | 1 | 1 | 1 | | | 1 | 1 | 1 | | | 1 | | | |
| C7 | | | | | | 1 | 1 | 1 | 1 | | | | 1 | | 1 | | | | | 1 | | | 1 | | | | 1 | | 1 | | | | |
| | 3 | 5 | 12 | 24 | 48 | 96 | 192 | 5 | 10 | 20 | 40 | 80 | 160 | 9 | 18 | 36 | 72 | 144 | 17 | 34 | 68 | 136 | 33 | 66 | 132 | 65 | 130 | 129 | 7 | 14 | 133 | 56 | |
| | | | | | | | | | | | | 8C2 CODES | | | | | | | | | | | | | | | | 8C3 CODES | | | | | |

Fig. 5B

Last 32 Bits of 64 Bit Word, Using Minimum Number Plus 1 of Check Bits, 8 Check Bits (SEC/SED)

| | 32 | 33 | 34 | 35 | 36 | 37 | 38 | 39 | 40 | 41 | 42 | 43 | 44 | 45 | 46 | 47 | 48 | 49 | 50 | 51 | 52 | 53 | 54 | 55 | 56 | 57 | 58 | 59 | 60 | 61 | 62 | 63 | |
|---|---|---|---|---|---|---|---|---|---|---|---|---|---|---|---|---|---|---|---|---|---|---|---|---|---|---|---|---|---|---|---|---|---|
| C0 | 1 | | 1 | | | | | 1 | | | | 1 | | | 1 | | | 1 | | | 1 | | | | | | | | 1 | | | 1 | 19 |
| C1 | | 1 | | 1 | | | | | | | 1 | | | 1 | | 1 | 1 | | | 1 | | 1 | | 1 | | 1 | | | | 1 | | | 21 |
| C2 | 1 | | | | 1 | | | 1 | | 1 | | | | | | 1 | | | 1 | 1 | 1 | | 1 | 1 | | | | 1 | 1 | | | | 21 |
| C3 | 1 | | 1 | | 1 | 1 | | | 1 | | | | | 1 | | | 1 | 1 | | | | 1 | 1 | | | | | | | 1 | | | 21 |
| C4 | | | 1 | 1 | | 1 | 1 | | 1 | 1 | | 1 | | | 1 | | | | 1 | | | | | 1 | 1 | | 1 | | | | 1 | | 21 |
| C5 | 1 | | | | | | 1 | 1 | | 1 | | 1 | 1 | | | | | 1 | | | 1 | | | | 1 | 1 | 1 | 1 | | | | | 21 |
| C6 | 1 | | | | | | | | | | 1 | | 1 | | | | 1 | | | | | | 1 | 1 | 1 | | | | 1 | 1 | | | 21 |
| C7 | 1 | | | | | 1 | | | | | | | | | | 1 | | | | | | | | | | | | | | | 1 | 1 | 19 |
| | 145 | 224 | 13 | 26 | 52 | 104 | 208 | 25 | 50 | 100 | 200 | 49 | 98 | 196 | 97 | 194 | 69 | 42 | 84 | 168 | 11 | 22 | 44 | 88 | 176 | 19 | 38 | 140 | 67 | 146 | 76 | 131 | |
| | | | | | | | | | | | | | | | | 8C3 CODES | | | | | | | | | | | | | | | | | |

CIRCUIT AND TECHNIQUE FOR REDUCING PARITY BIT-WIDTHS FOR CHECK BIT AND SYNDROME GENERATION FOR DATA BLOCKS THROUGH THE USE OF ADDITIONAL CHECK BITS TO INCREASE THE NUMBER OF MINIMUM WEIGHTED CODES IN THE HAMMING CODE H-MATRIX

CROSS REFERENCE TO RELATED PATENT APPLICATIONS

The present invention is a divisional of and claims priority from U.S. patent application Ser. No. 11/855,070 filed Sep. 13, 2007, which issued as U.S. Pat. No. 7,962,837 and is incorporated herein by reference in its entirety.

BACKGROUND OF THE INVENTION

The present invention relates, in general, to the field of data storage and data communication. More particularly, the present invention relates to a technique for reducing parity bit-widths for check bit and syndrome generation through the use of additional check bits to increase the number of minimum weighted codes in the Hamming Code H-Matrix.

The use of Hamming code provides a method for protecting data blocks against single bit errors such that any single bit error can be detected and corrected. In general, a Hamming Code is usually described by the use of a matrix, called the Hamming matrix, or H-matrix. The H-Matrix is an (n–k) by n matrix which defines which data bits are used to combine with each check bit for generating the syndrome.

Many different methods have been employed to date in an attempt to minimize power consumption and reduce circuit complexity for parallel error correction code (ECC) applications. See, for example, Ghosh, S. et al.; "*Selecting Error Correction Codes to Minimize Power in Memory Checker Circuits*"; Journal of Low Power Electronics, Vol. 1, pp. 63-72, 2005 and Ghosh, S. et al.; "*Reducing Power Consumption in Memory ECC Checkers*", Proceedings of the IEEE International Test Conference (ITC-2004), Charlotte, N.C., October 2004, the disclosures of which are herein incorporated by reference.

Prior ECC implementations use well-known equations for determining the minimum number of redundant bits required for the level of correction/detection and word length used. Generally, single error correction/single error detection (SEC/SED) or single error correction/double error detection (SEC/DED) techniques ECC are used, but higher levels of correction and detection are possible using the same basic concepts. The equations below provide the necessary Hamming distance and number of redundant bits needed to implement either SEC/SED or SEC/DED capability. The number of redundant bits (Check Bits) for a specific word length determines the error correction/detection capability, but in addition, the number of check bits determines the number of vectors available for each weighted code in the H-Matrix.

For SEC/SED, Hamming Distance=3:

$$\log_2(n)+1 \geq n-k$$

where n is the number of codeword bits,
where k is the number of data bits,
(n–k) is the number of redundant bits (Check Bits)
For SEC/DED, Hamming Distance=4:

$$\log_2(n)+2 \geq n-k$$

This is similar to the preceding equation with one more check bit required over that required for SEC/SED.

In most SEC/DEC applications, only "odd" weighted codes are used (commonly known as Odd Weighted Hsiao Codes), eliminating the use of Weight=2 codes. If all weight codes are used, the method to comprehend double bit detection becomes more complicated.

Previously, however, no one has disclosed the technique of using "excessive" or extra check bit redundancy in Single Error Correction/Single Error Detection (SEC/SED) for ECC applications to serve to reduce the width of the parity circuit for check bit or syndrome generation.

SUMMARY OF THE INVENTION

Briefly, the circuit and technique of the present invention disclosed herein is implemented through the addition of redundant Check Bit(s) to increase the number of minimum weight codes in the H-matrix. The technique may be implemented while adding no additional correction/detection capability, in order to reduce the number of data bits that are used for each check bit/syndrome generation.

Stated another way, the technique of the present invention utilizes extra redundant Check Bit(s), not for the purpose of extending error correcting capabilities, but rather to increase the number of low weighted codes, particularly Weight=2 codes for SEC/SED or Weight=3 codes for SEC/DED, in order to reduce the width of the parity generating circuitry.

The technique disclosed herein makes advantageous use of additional Check Bits to increase the number of minimum weighted codes in the H-matrix, without regard to improvement in error detection/correction capability in order to reduce the parity bit-widths used for check bit and syndrome generation.

Among the advantages realized in implementing the technique of the present invention are:

1) The width of the parity generators for check bit generation and for syndrome generation are significantly reduced and fewer Exclusive OR (XOR) circuits are required for each Check Bit/Syndrome;

2) The depth of the XOR "Tree" to generate the Check Bits or Syndrome can be reduced. When lower "Tree" depths (fewer gates in the propagation path) are used, faster operating speeds can be achieved which is especially important in clocked applications where delays within a pipeline delay limit overall device performance;

3) Each data bit is connected to fewer parity loads since only minimum weighted codes are used; and 4) The total number of XOR gates is reduced, even when additional Check Bits are comprehended. This results in less transient noise and lower power requirements.

In prior art techniques, increasing the number of Check Bits without improving the correction or detection capabilities could not be justified. However, with increased clock rates (higher frequency performance) and the need to keep power requirements down with increased frequency, adding check bits to reduce parity bit-width used in ECC will become an acceptable solution.

Particularly disclosed herein is a technique for selecting parity bit-widths which comprises establishing a first number of check bits required for generation of check bits and syndromes based upon the first number of check bits, utilizing a second number of check bits greater than the first number of check bits to increase the number of minimum weighted codes in a Hamming code H-matrix and generating the check bits and syndromes based upon the second number of check bits.

Also disclosed herein is a technique for selecting parity bit-widths comprising which comprises establishing a first number of check bits required for generation of check bits and syndromes based upon the first number of check bits and adding at least one additional check bit to the first number of check bits to provide a second number of the check bits and increase a number of low weighted Hamming codes.

Also further disclosed herein is an error correction circuit which comprises a write parity generator for receiving k write data bits on an input data bus, a memory coupled to the write parity generator for receiving n–k check bits, (where n is the number of codeword bits) and the k write data bits from the input data bus. A read parity generator is coupled to the memory for receiving n–k read check bits and k read data bits while a syndrome decoder is coupled to the read parity generator for receiving n–k syndrome bits. A data corrector is coupled to the syndrome decoder for receiving k inverse bits and the k read data bits from said memory. The data corrector supplies k bits of corrected data on an output data bus.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 2 is a table of the number of check bits versus the number of weighted codes in accordance with the technique of the present invention;

FIGS. 3A-3D are representative H-Matrix examples for 32 bit words using the minimum number of check bits for 6, 7 (minimum plus 1), 8 (minimum plus 2) and 9 (minimum plus 3) check bits respectively in accordance with the technique of the present invention;

FIGS. 4A and 4B are collectively an additional representative H-Matrix example for a 64 bit word using the minimum number of check bits for 7 check bits; and FIGS. 5A and 5B are collectively another representative H-Matrix example for a 64 bit word using the minimum number of check bits for 8 (minimum plus 1) check bits in accordance with the technique of the present invention.

DESCRIPTION OF A REPRESENTATIVE EMBODIMENT

Figure 1:
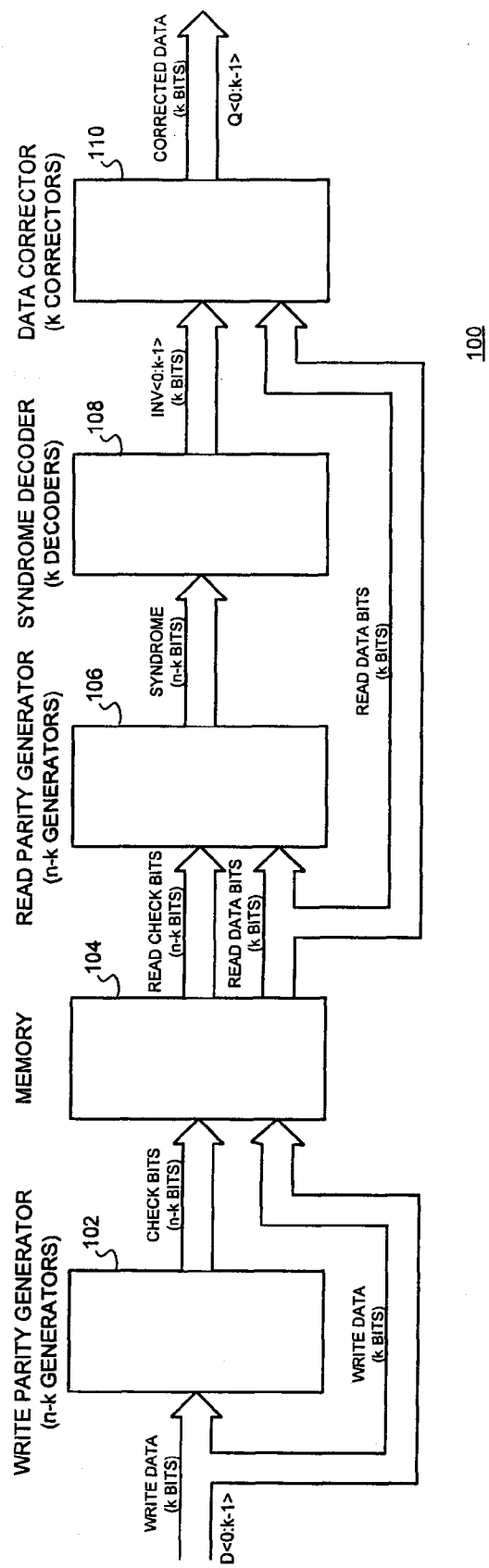
FIG. 1 is a representative SEC/SED error correction flow circuit implementation of the technique of the present invention.

With reference now to FIG. 1, a representative SEC/SED error correction flow implementation 100 of the technique of the present invention is shown. The implementation 100 receives a number of write data bits (k bits) on a data bus of width D<0:k–1>. These data bits are received by a write parity generator 102 comprising n–k number of generators as shown.

The write parity generator 102 then supplies a number of check bits (n–k) to a memory 104 which is also coupled to the data bus D<0:k–1> for receiving the write data also supplied to the write parity generator 102. The memory 104, in turn, supplies a number of read check bits (n–k bits) and read data bits (k bits) to a read parity generator 106 comprising n–k number of generators as well. The read parity generator 106 provides a syndrome (n–k bits) to a syndrome decoder 108 comprising k decoders.

The syndrome decoder 108 provides k bits of invert data signal on an INV<0:k–1> bus to a data corrector block 110 comprising k correctors. The data corrector block 110 also receives k read data bits from the memory 104. Output of the data corrector 110 is k bits of corrected data on data output bus Q<0:k–1>.

In the particular implementation of the invention disclosed herein, "n" is the number of codeword bits; "k" is the number of data bits and "n–k" is the number of check bits and syndrome bits. The width (or number of inputs) of the write parity generator 102 is the maximum number of "1 s" in a row of the H-matrix as will be described more fully hereinafter. In addition, the width of the read parity generator 106 is one more than the maximum number of "1 s" in a row of the H-matrix.

For reads, one more bit is required because the stored check bit value has to be added to the parity field in order to generate the syndrome to determine if an error has occurred. This too will be more fully described hereinafter. It should be noted that a non-zero syndrome indicates an error and the syndrome value is the vector to identify which bit failed. The weight of the code is determined by the number of "1s" in the column direction of the H-matrix.

Stated another way, the Hamming weight is the number of non-zero coefficients in a polynomial over GF(2). For example, w(01101010)=4. The Hamming distance between two words is the Hamming weight of their sum. For example, $d_{Hamming}$=(01101010, 10101000)=w(11000010)=3. In comparing two bit patterns, the Hamming distance is the count of bits different in the two patterns. More generally, if two ordered lists of items are compared, the Hamming distance is the number of items that do not identically agree.

With reference additionally now to FIG. 2, a table of the number of check bits versus the number of weighted codes in accordance with the technique of the present invention is shown. The total number of weight>1 codes is shown to the far right for each of the rows representing check bits 5 through 11.

The advantage of increasing the number of minimum weight codes can be seen by example with respect to this table. To this end, reference is made specifically to the rows indicated by 7 and 8 check bits respectively and their corresponding code weights 2 through 7 and 2 through 8. It should be noted that the code weight of "0" is not available inasmuch as it is a reserved vector signifying "no errors" while the code weight of "1" is also not available as it is a reserved vector for a "check bit error".

For a 64 bit word, SEC/SED requires 7 Check Bits and this example results in:
Number of Weight=2 codes: 21
Number of Weight=3 codes: 35
Number of Weight=4 codes: 35
Number of Weight=5 codes: 21
Number of Weight=6 codes: 7
Number of Weight=7 codes: 1
Total Number Weight>1 codes: 120

If 64 vectors are selected using minimum weight codes, then:
Number of Weight=2 codes: 21
Number of Weight=3 codes: 35
Number of Weight=4 codes: 8

When the above vectors are used, the maximum parity width required is 26 bits for writes (check bit generation) and 27 bits for reads (syndrome generation; one more than that required for writes). This can be seen particularly with respect to FIGS. 4A and 4B wherein the maximum number of "1s" is each row of the H-matrix illustrated is shown to be 26.

In accordance with the technique of the present invention additional redundancy bits are added for the purpose of increasing the number of minimum weight codes. So, if one additional redundancy Check Bit is added, 8 check bits would be used.

As before, for a 64 bit word, SEC/SED, using 8 check bits, this example results in:
Number of Weight=2 codes: 28
Number of Weight=3 codes: 56
Number of Weight=4 codes: 70
Number of Weight=5 codes: 56
Number of Weight=6 codes: 28
Number of Weight=7 codes: 8
Number of Weight=8 codes: 1
Total Number Weight>1 codes: 247

If 64 vectors are selected using minimum weight codes, then:
Number of Weight=2 codes: 28
Number of Weight=3 codes: 36

When the above vectors are used, the maximum parity width required is 21 bits for writes (check bit generation) and 22 bits for reads (syndrome generation). This can be seen particularly with respect to FIGS. 5A and 5B wherein the maximum number of "1s" is each row of the H-matrix illustrated is shown to be 21. Therefore, it can be seen that the result of adding the extra check bit reduces the parity width for check bit generation from 26/27 (7 check bit example; write/read) to 21/22 (8 check bit example; write/read).

With reference additionally now to FIGS. 3A-3D, representative H-Matrix examples for 32 bit words using the minimum number of check bits for 6, 7, 8 and 9 check bits are shown. With respect to the H-matrix of FIG. 3A in particular (using 6 check bits C0 through C5), it can be seen that the maximum parity width required would be 14 bits for writes (check bit generation) and 15 bits for reads (syndrome generation). In comparison, respect to the H-matrix of FIG. 3B (using 7 check bits C0 through C6; i.e. the minimum plus 1), it can be seen that the maximum parity width required would be only 11 bits for writes and 12 bits for reads.

In like manner, with respect to the H-matrix of FIG. 3C in particular (using 8 check bits C0 through C7; i.e. the minimum plus 2), it can be seen that the maximum parity width required would be only 9 bits for writes and 10 bits for reads. Taking this a step further, with respect to the H-matrix of FIG. 3D (using 9 check bits C0 through C8; i.e. the minimum plus 3), it can be seen that the maximum parity width required would be a still lesser 8 bits for writes and 9 bits for reads.

With reference additionally now to FIGS. 4A and 4B collectively, an additional representative H-Matrix example for a 64 bit word using the minimum number of check bits for 7 check bits is shown. As has been previously described, the maximum number of "1s" in a row of this H-matrix can be seen to be 26.

With reference additionally now to FIGS. 5A and 5B collectively, another representative H-Matrix example for a 64 bit word using the minimum number of check bits for 8 check bits (the minimum plus 1) is shown. As has also been previously described, the maximum number of "1s" in a row of this H-matrix can be seen to be 21.

Briefly, the technique of the present invention disclosed herein is implemented through the addition of redundant Check Bit(s) to increase the number of minimum weight codes in the H-matrix. The technique may be implemented while adding no additional correction/detection capability, in order to reduce the number of data bits that are used for each check bit/syndrome generation.

Further, while in the examples disclosed herein SEC/SED has been utilized, it will be appreciated that the same concepts can be extended to ECC applications that have greater ECC capabilities, including multiple error correction. For SEC/SED, Weight=2 codes are increased, for SEC/DED, Weight=3 codes are increased by adding additional Check Bit(s). The advantages of the present invention may be achieved at the limited expense of using additional redundant Check Bit(s) and decoding a wider syndrome word.

While there have been described above the principles of the present invention in conjunction with specific examples and SEC/SED techniques, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

As used herein, the terms "comprises", "comprising", or any other variation thereof, are intended to cover a non-exclusive inclusion, such that a process, method, article, or apparatus that comprises a recitation of certain elements does not necessarily include only those elements but may include other elements not expressly recited or inherent to such process, method, article or apparatus. None of the description in the present application should be read as implying that any particular element, step, or function is an essential element which must be included in the claim scope and THE SCOPE OF THE PATENTED SUBJECT MATTER IS DEFINED ONLY BY THE CLAIMS AS ALLOWED. Moreover, none of the appended claims are intended to invoke paragraph six of 35 U.S.C. Sect. 112 unless the exact phrase "means for" is employed and is followed by a participle.

What is claimed is:

1. An ECC circuit for selecting parity bit-widths comprising: circuitry for establishing a minimum first number of check bits required for generation of check bits and syndromes for a desired Hamming distance based upon said first number of check bits; circuitry for utilizing a second number of check bits greater than said first number of check bits to increase the number of minimum weighted codes in a Hamming code H-matrix; and circuitry for generating said check bits and syndromes based upon said second number of check bits.

2. The circuit of claim 1 further comprising circuitry for utilizing said second number of check bits to reduce the width of a parity generation circuit.

* * * * *